United States Patent [19]

Heise et al.

[11] Patent Number: 4,859,548
[45] Date of Patent: Aug. 22, 1989

[54] METHOD FOR GENERATING A LATTICE STRUCTURE WITH A PHASE SHIFT ON THE SURFACE OF A SUBSTRATE

[76] Inventors: Gerhard Heise, Bert-Brecht-Allee 10, D8000 Munich 83; Ulrich Wolff, Geigenberger Str. 351, D8000 Munich 71; Richard Matz, Maringerstr. 24a, D8152 Feldkirchen, all of Fed. Rep. of Germany

[21] Appl. No.: 923,439

[22] Filed: Oct. 27, 1986

[30] Foreign Application Priority Data

Nov. 4, 1985 [DE] Fed. Rep. of Germany ....... 3539092
Dec. 19, 1985 [DE] Fed. Rep. of Germany ....... 3545102

[51] Int. Cl.$^4$ .............................................. G03H 1/28
[52] U.S. Cl. ........................................ 430/1; 430/279; 430/320; 430/323; 430/394; 430/395; 350/3.68
[58] Field of Search .................. 430/1, 2, 394, 311, 430/323, 297, 320, 395; 350/3.68, 162.2; 372/96, 102

[56] References Cited

U.S. PATENT DOCUMENTS 4,402,571 9/1983 Cowan et al. .................. 350/162.71

FOREIGN PATENT DOCUMENTS 0188919 7/1986 European Pat. Off. ............ 430/321

OTHER PUBLICATIONS

"Antisymmetric Taper of Distributed Feedback Lasers", Hermann A. Haus et al., *IEEE Journal of Quantum Electronics*, vol. QE-12, No. 9, Sep. 1976, pp. 532-539.
"1.5 μm Phase-Shifted DFB Lasers for Single-Mode Operation", K. Sekartedjo et al., *Electronics Letters*, Jan. 19, 1984, vol. 20, No. 2, pp. 80-1.
"η/4-Shifted InGaAsP/InP DFB Lasers by Simultaneous Holographic Exposure of Positive and Negative Photoresists", K. Utaka et al., *Electronics Letters*, Nov. 22, 1984, vol. 20, No. 24, pp. 1008-1010.
"Coupled-Wave Theory of Distributed Feedback Lasers", H. Kogelnik and C. V. Shank, *J. Appl. Phys.*, vol. 43, No. 5, May 1972, pp. 2327-2335.
"Effect of Mirror Facets on Lasing Characteristics of Distributed Feedback InGaAsP/InP Laser Diodes at 1.5 m Range", K. Utaka et al., *IEEE Journal of Quantum Electronics*, vol. QE-20, No. 3, Mar. 1984, pp. 236-245.
"Improvements in the Modulation Amplitude of Submicron Gratings Produced in n-InP by Direct Photoelectrochemical Etching" Lum et al., *Appl. Phys. Lett.*, vol. 47, No. 3, Aug. 1, 1985, pp. 269-271.

Primary Examiner—José G. Dees

[57] ABSTRACT

A method for generating a lattice structure with a phase shift on a surface of a substrate characterized by the steps of exposing of a photo-sensitive surface in an optical interference field and then subsequently exposing the same surface to a second interference field with the spatial frequencies of the two interference fields being changed a small amount between the two exposures. The photo-sensitive surface can be a photoresist layer applied on the substrate. After developing of the layer, this lattice structure is produced by etching. Another embodiment of the method is produced by means of a laser-active etching wherein the photo-sensitive surface is compound of a substrate surface in contact with an etchant and the etchant reaction is activated by the exposure.

16 Claims, 2 Drawing Sheets

METHOD FOR GENERATING A LATTICE STRUCTURE WITH A PHASE SHIFT ON THE SURFACE OF A SUBSTRATE

BACKGROUND OF THE INVENTION

The present invention is directed to a method for generating a lattice structure with a phase skip or shift on a surface of a substrate by exposing a photo-sensitive surface in an optical interference field and developing the exposed surface.

For optical communications technology, special semiconductor lasers, which also emit in a single, longitudinal oscillatory mode at a modulation frequency, are required in order to achieve high data rates on long transmission links. A fundamentally suitable type of laser is the laser with a distributed feedback which laser is referred to as a DFB-laser wherein DFB is an abbreviation for distributed feedback and wherein the feedback of the light in the laser resonator does not occur by means of two mirrors but occurs by means of reflection grating superimposed on the entire laser structure. In general, however, a DFB-laser does not oscillate in only one mode but in two modes. Single-mode light emission, however, can be induced among other things by dividing the lattice structure into two sub-gratings whose phases are shifted relative one another by half a lattice constant, for example, by one fourth of the light wavelength. Such DFB-lasers with the phase skip or shift are disclosed, for example, in an article by H. A. Haus et al "Antisymmetric Taper of Distributed Feedback Lasers", *IEEE Journal of Quantum Electronics*, Vol. QE-12, No. 9, Sept. 1976, pages 532-539.

Lattice structures for DFB-lasers are currently predominantly produced by holographic lithography, for example, by exposure of a photo-resist layer applied on the surface of a laser substrate of the semiconductor material by exposure to an optical interference field, then developing the layer and etching the surface covered with the developed photo-resist layer, whereby a relief-like lattice structure having a spatial frequency corresponding to the spatial frequency of the interference field will occur in the surface of the substrate. The remaining steps of the laser manufacture occur in a known manner.

The optical interference field is produced by optical superimposition of two coherent light waveguides. However, only simple grating structures without phase shifts will occur.

For generating a lattice structure with a phase shift, electron beam writers are presently utilized as disclosed by an article by K. Sekartedjo et al, "1.5 μm Phase-Shifted DFB-Lasers for Single-Mode Operation" *Electronics Letters*, Vol. 20, No. 2, Jan. 19, 1984, pages 80-81. Another method is a holographic lithography method with combined employment of positive and negative photoresist to produce the phase shift. This method is disclosed by K. Utaka et al, "λ/4-Shifted InGaAsP/InP DFB Lasers by Simultaneous Holographic Exposure of Positive and Negative Photoresists", *Electronics Letters*, Vol. 20, No. 24, Nov. 22, 1984, pages 1008-1010. Both of these methods have disadvantages. For example, the first method requires an extremely costly electron beam writer. The second method involves a technologically complicated method which leads one to expect high rejection rates in the laser production. In both instances, the manufacture of the lattice structure is a time consuming process.

SUMMARY OF THE INVENTION

The object of the present invention is to provide a particularly simple method for producing a lattice structure with a phase shift, particularly lattice structure for DFB-lasers. This may be accomplished with an improvement in a method for generating a lattice structure with a phase shift in a surface of a substrate by providing a substrate having a photo-sensitive surface, exposure of the photo-sensitive surface in an optical interference field and by developing the exposed surface. The improvements are that the step of exposing the photo-sensitive surface exposes the surface to at least two superimposed exposures of at least two different interference fields differing in their spatial frequencies.

The method of the invention consequently differs from the currently standard holographic lithography for producing a lattice structure without a phase shift for a DFB-laser essentially only on the basis of a superposed exposure of the photoresist in at least two optical interference fields of different spatial frequencies.

In accordance with one embodiment of the invention, the provision of the substrate with a photo-sensitive surface provides a substrate having a photoresist layer on the surface and the photoresist layer is developed after the superimposition of the two exposures so that the surface of the substrate covered with the developed photoresist layer is etched with an etchant which attacks the surface of the substrate. In another embodiment of the invention, the photo-sensitive surface is composed of the substrate surface which is in contact with an etchant and the etchant reaction thereon is activated by the exposure. The execution or the technique of a mask-free laser-active etchant is disclosed in an article by R. M. Lum, F. W. Ostermayer Jr., P. A. Kohl, A. M. Glass and A. A. Ballman in *Applied Physics Letter*, Volume 47 No. 3, August 1985, pages 269-271.

The method of obtaining the two exposures of two different interference fields differing in spatial frequencies can be obtained in one of three ways. In one method, the photo-sensitive surface or layer is exposed in a first interference field of two planar, coherent waves and then a second field having different angles of incidence which is obtained by pivoting the substrate relative to the direction of the beams between the first and second exposure. In the second method, the photo-sensitive surface is exposed in an interference field formed by diverging and coherent light waves with the first exposure being obtained with a first spacing and then moving the substrate relative to the waves to obtain a larger or second spacing. A final method of obtaining the different spatial frequencies of the two interference fields is to position a substrate relative to a mirror with the mirror and substrate being in the path of a planar wave with portions of the wave being reflected by the mirror onto the substrate to form the interference. Then rotating the mirror and substrate after the first exposure to obtain the second exposure with different angles of incidence.

DESCRIPTION OF THE PREFERRED EMBODIMENTS

Figure 1:
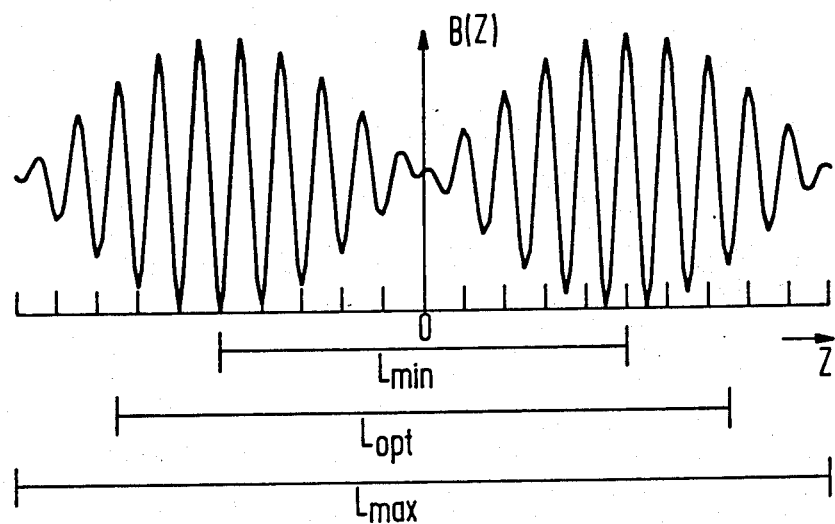
FIG. 1 is a graphic representation of the defined exposure function B(Z) for generating a lattice structure of a DFB-laser wherein the minimum length $L_{min}$, the optimum length $L_{opt}$ and the maximum length $L_{max}$ of the laser are specifically related to this function.

It shall be assumed by way of an example below that a photo-sensitive layer of a substrate, i.e. a photoresist layer or respectively a surface of a substrate in contact with etching fluid is double exposed in an interference field whereby a spatial frequency K of the interference field is modified by a small amount $2\Delta K$ between the individual exposures.

The exposure function $B_1(Z)$ of a first exposure, i.e. the location dependency of the light intensity in the Z-direction on the photo-sensitive layer may be assumed to amount, for example, to about $$B_1(Z) = B_0(1 + \sin(K + \Delta K)Z). \quad (1)$$

Let the exposure function of the second exposure amount to $$B_2(Z) = B_0(1 = \sin(K - \Delta K)Z). \quad (2)$$

The exposure function of the overall exposure is established by $$B(Z) = B_1(Z) + B_2(Z) = B_0(2 + \sin(K + \Delta K)Z - \sin(K - \Delta K)Z) = B_0(2 + 2\sin(\Delta K \cdot Z)\cos(K \cdot Z) \quad (3)$$

This is an exposure function having the spatial frequency K modulated with the modulation function $\sin\Delta K \cdot Z$. The operational sign change of the modulation function at the locations $\Delta K \cdot Z = N \cdot \pi$ can also be interpreted as a phase shift of the modulated function at these Z-values:

$$\frac{B(Z)}{B_0} = 2 + 2 \cdot |\sin\Delta K \cdot Z| = \begin{cases} \cos K \cdot Z \text{ for} \\ 2N\frac{\pi}{\Delta K} < Z \leq (2N+1)\frac{\pi}{\Delta K} \\ \cos(K \cdot Z + \pi) \text{ for} \\ (2N-1)\frac{\pi}{\Delta K} < Z < 2N\frac{\pi}{\Delta K} \end{cases} \quad (4)$$

wherein N is a whole number. The exposure function B(Z) is thus a lattice function having a phase shift at the spacing $\Delta Z = \pi/\Delta K$.

The exposed photoresist layer is developed and the lattice structure is transferred to the semiconductor material of the substrate by etching. The remaining steps of the laser manufacturing likewise occurs in a known and conventional manner.

The length L of the laser is selected such that a phase shift falls into the center of the laser and such that L does not become greater than the period $L_{max} = 2\pi/\Delta K$ of the modulation function $\sin\Delta K \cdot Z$. On the other hand, the maximum modulation depth of the lattice should still be reached in the laser, for example, L should not be less than half the period $L_{min}$ of the modulation function, i.e.

$$\frac{\pi}{\Delta K} \leq L \leq \frac{2\pi}{\Delta K} \quad (5)$$

should apply.

The product $L \cdot K = L_{opt} \cdot K$ is preferably selected at about 4.6.

For a prescribed laser length L of, for example, about 500 µm, a value of about three lines/mm thereby occurs for the change in spatial frequency $2\Delta K/2\pi$ between the two exposures.

Three expedient and advantageous embodiments of the method of double exposure of the photo-sensitive surface of the substrate shall be set forth with reference to FIGS. 2-5.

Figure 2:
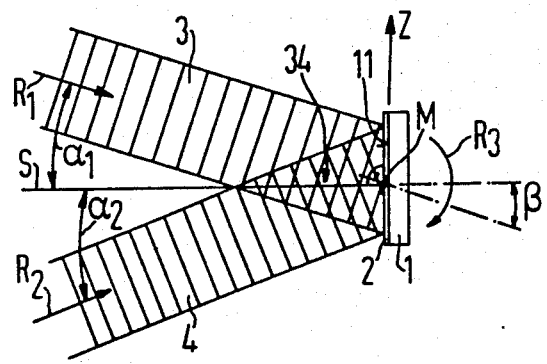
FIG. 2 is a schematic illustration of the exposure of a photoresist layer on a surface of the substrate in an optical interference field of two optically superimposed, planar coherent light waves.
Figure 3:
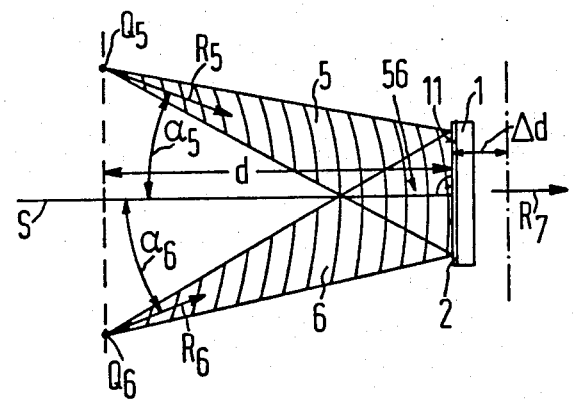
FIG. 3 is a schematic presentation of the exposure of the photoresist layer on the surface of a substrate in an interference field of two optically superimposed, divergent coherent light waves.
Figure 4:
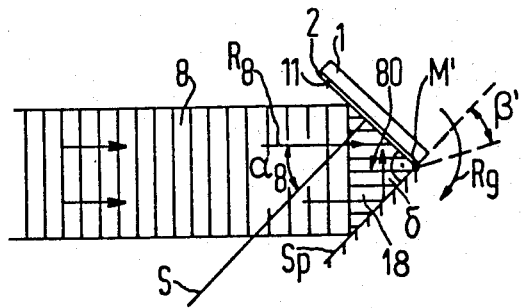
FIG. 4 is a schematic illustration of the exposure of a photoresist layer on the surface of a substrate in an interference field of a planar light waveguide and a part of the wave optically superimposed thereon by reflection from a mirror.

In these FIGS., a substrate 1 has a surface 11 and a line S which extends perpendicular to the surface 11. The plane of incidence in which the optical superposed light waves are incident is the plane of the drawing in all FIGS. 2-5. In FIGS. 2-4, the photo-sensitive surface of the substrate 1 is composed of a photoresist layer 2 which is applied on the surface 11.

In accordance with FIG. 2, two coherent planar waves 3 and 4 are incident from two different directions $R_1$ and $R_2$ and superimposed in front of the photoresist layer 2 and form an interference field 34 which generates interference strips on the photoresist layer 2 which strips are parallel and proceed perpendicular to the plane of the drawing. The spatial frequency K of these interference strips can be set to a large degree by the angle of incidence of the planar waves and by their wavelength. The angle of incidence of the planar waves 3 or 4 is established and is known by the angles $\alpha_1$ and $\alpha_2$ measured between the allocated directions $R_1$ and $R_2$ and the perpendicular line S.

In the method, the photoresist layer 2 is exposed for an adequately long exposure time with these interference strips.

For the second exposure, the angle of incidence $\alpha_1$ and/or $\alpha_2$ of the planar waves 3 and 4 is changed. This is most easily accomplished by the substrate 1 being turned around an axis M which extends perpendicular to the plane of the paper. For example, rotating the substrate in the direction of the arrow $R_3$ through an angle $\beta$. The modified angles of incidence in this case are established by $\alpha_1 + \beta$ and $\alpha_2 - \beta$. As a result thereof, the spatial frequency K of the interference strips on the photoresist layer 2 changes by itself. The required change $\Delta K$ in the spatial frequency can be set by the amount of the angle $\beta$ by which rotation is carried out. The position of the rotational axis M is relatively uncritical.

An embodiment of the method, which is illustrated in FIG. 3, has two coherent, divergent waves 5 and 6 each coming from a source point or line $Q_5$ and $Q_6$, respectively, these waves 5 and 6 are incident from various directions $R_5$ and $R_6$ and superimposed in front of the photoresist layer of the substrate 1. They form an interference field 56 which, likewise, generates interference strips on the photoresist layer 2. Given prescribed angles of incidence $\alpha_5$ and $\alpha_6$ of the divergent waves 5 and 6, the spatial frequency K of these interference strips can be largely adjusted by the spacing d of the photoresist layer from the source points $Q_5$ and $Q_6$.

When the spacing d for the one exposure is selected, then this spacing d is enlarged or, on the other hand, reduced for the second exposure by displacement in, for example, the direction $R_7$ parallel to the perpendicular line S. The spatial frequency for the interference strips on the photoresist layer 2, thereby changes by itself. The required change $\Delta K$ of spatial frequency can be set by means of the spacing change $\Delta d$.

In accordance with FIG. 4, the substrate 1 is rigidly connected to a planar mirror Sp, which is arranged relative thereto at an angle $\partial$ of, for example, 90°. A planar wave 8 is incident from direction $R_8$ both directly onto the photoresist layer 2 as well as onto the mirror Sp. The mirror Sp reflects a component 18 of the planar wave 8, for example, half of the planar wave incident on it into the direction of the photoresist layer 2. An interference field 80 thus occurs in front of the photoresist layer 2 and this interference field 80 generates interference strips on this layer whose spatial frequency K is dependent on the angle of incident $\alpha_8$ of the planar wave onto the photoresist layer 2 as well as the angle $\partial$ between the mirror Sp and the photoresist layer 2 or, respectively, surface 11.

When the spatial frequency K for one exposure is selected, then a change $\Delta K$ of the spatial frequency for the second exposure can be simply set by means of the common rotation of the substrate 1 and mirror Sp around an axis M', for example, in the direction of the arrow $R_9$ such as through an angle $\beta'$. As is the embodiment of FIG. 2, the required change $\Delta K$ of spatial frequency can thereby be set by the amount of the angle $\beta'$ by which the rotation is carried out. Here, too, the position of the rotation axis M' is relatively uncritical.

Figure 5:
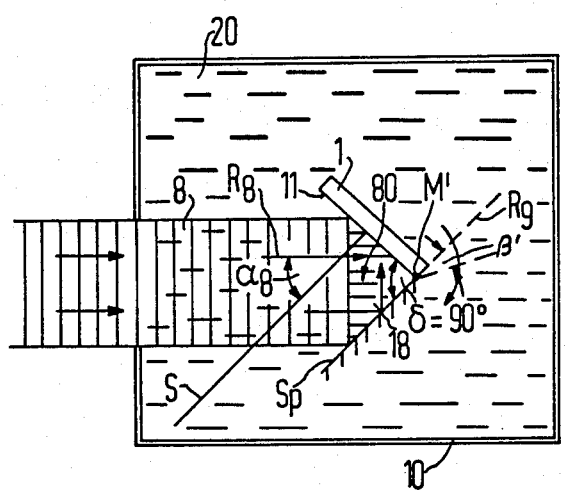
FIG. 5 is a schematic illustration of the exposure of a surface of the substrate in contact with an etching fluid activatable by exposure wherein the exposure is the interference field of a planar light wave and a component of the light wave optically superimposed therewith as it is reflected by a mirror.

In FIG. 5, the photo-sensitive surface of the substrate 1 is composed of a surface 11 which is in contact with an etching fluid 20 which is activated by exposure. Otherwise, the entire arrangement of FIG. 5 corresponds t the arrangement of FIG. 4 whereby the mutually corresponding elements have the same reference characters. Differing from FIG. 4, the arrangement of FIG. 5 is enclosed in a transparent cell 10 containing the etching fluid 20.

The chemical reaction is triggered directly by the substrate material at the surface 11 of the substrate due to the incident laser light 8. The creation of the lattice with a phase shift proceeds in an entirely analogous fashion as given the employment of the photoresist. In other words, during the first exposure step, for example, the lattice having a first lattice constant $2\pi/K = \Lambda + \Delta \Lambda$ is produced. In the second exposure step, a lattice having a lattice constant $2\pi/[K] = \Lambda - \Delta \Lambda$ is produced. The lattice resulting from the superimposition of the two lattices has a mean lattice constant $\Lambda$ which is sinusoidally modulated with the period $\Delta \Lambda$.

Coming into consideration as etching agent are all liquids and gasses known for laser-active etching. For example, a mixture of one part $H_2SO_4$, one part $H_2O_2$ and 10 parts $H_2O$, as set forth in the above mentioned reference from *Applied Physics Letter*, can be employed. This etchant material, for example, is suitable for a substrate material of GaAs.

The same critical arrangement for exposure can be employed for the manufacture of the lattice structure on the basis of laser-active etching and for manufacture by means of photoresist. In the method of FIG. 5, thus, the arrangements of either FIG. 2 or FIG. 3 can also be employed instead of the arrangement of FIG. 4.

Although various minor modifications may be suggested by those versed in the art, it should be understood that we wish to employ within the scope of the patent granted hereon, all such modifications as reasonably and properly come within the scope of our contribution to the art.

We claim:

1. In a method for generating a lattice structure on the surface of a substrate by providing a substrate with a photo-sensitive surface, holographically exposing the photo-sensitive surface by creating an optical interference field of light waves to expose the photo-sensitive surface and subsequently developing the exposed surface, the improvements comprising said step of holographically exposing including creating a first interference field of a spatial frequency, creating a second interference field of a different spatial frequency relative to the spatial frequency of the first field and superimposing these first and second fields onto the photo-sensitive surface to expose the surface with both fields to create a lattice structure with a phase shift determined by said two fields.

2. In a method according to claim 1, wherein the creating of each of the first and second interference fields is by projecting two planar, coherent waves to create the first field, and subsequently changing the angle of incidence of the two planar coherent waves on the substrate to create the second interference field.

3. In a method according to claim 1, wherein the step of creating the first and second interference fields comprises projecting two divergent coherent waves from two sources of divergent waves to create the first field, then changing the distance of the substrate from the two sources to obtain a different spacing for the second field and exposure.

4. In a method according to claim 1, wherein the step of providing the substrate provides a substrate attached to a mirror extending relative to the substrate surface at a fixed angle, the step of creating the first interference field projects a planar wave onto the surface of the substrate and the mirror with the mirror reflecting a portion of the wave onto the substrate to create the first interference field and the step of creating a second field includes changing the angle of incidence of the planar wave onto the mirror and substrate to create the second interference pattern.

5. In a method according to claim 4, wherein the step of changing the angle of incidence is by rotating the mirror and substrate on an axis extending perpendicular to the axis of the planar wave.

6. In a method according to claim 1, wherein the step of providing a substrate with a photo-sensitive surface comprises providing a substrate having a photoresist layer on the surface of the substrate, said developing comprising developing the photoresist subsequent to the exposure by said two fields and then etching the developed photoresist to attack the surface of the substrate to create the lattice structure.

7. In a method according to claim 6, wherein one step of creating the first and second interference fields creates a first interference field by projecting two planar coherent waves at an angle of incidence to the surface of the substrate and layer of photoresist, after exposing the photoresist to the first interference field, rotating the substrate on an axis extending perpendicular to the axis of each wave to create a second angle of incidence for the two waves and the second interference field.

8. In a method according to claim 6, wherein the step of forming first and second interference fields creates a first interference field by projecting two divergent coherent waves from sources of divergent waves onto the substrate, the step of creating of the second interference field comprises changing the distance between the substrate and the sources of divergent waves.

9. In a method according to claim 6, wherein the substrate having the photoresist layer is secured to a mirror at a given angle, said step of creating the first interference field comprises projecting a planar wave onto a portion of the photoresist layer and on the mirror with the mirror reflecting the wave onto the layer to create the first interference field, creating the second interference field by changing the angle of incident of the planar wave on the mirror and substrate.

10. In a method according to claim 9, wherein the step of changing the angle of incidence is by rotating both the mirror and substrate on an axis extending perpendicular to an axis of the planar wave.

11. In a method for generating a lattice structure on the surface of a substrate by providing a substrate having a photo-sensitive surface in contact with an etchant, said etchant having a reaction to etch said surface being activated by light being projected on said surface, and etching a lattice structure on said surface by creating a holographic optical interference field of light waves and projecting the field into the surface, the improvement comprising said step of creating a holographic optical interference field including creating a first interference field of a spatial frequency, creating a second interference field of a different spatial frequency relative to the spatial frequency of the first field and superimposing these first and second fields onto the photosensitive surface to etch a lattice structure with a phase shift determined by said two fields.

12. In a method according to claim 17, wherein the step of creating a first interference field projects two planar coherent waves under angles of incidence onto the photo-sensitive surface, said step of creating the second interference field being by changing the angle of incidence of the two planar waves on the substrate.

13. In a method according to claim 12, wherein the changing of the angle is by rotating the substrate on an axis extending perpendicular to an axis of said planar waves.

14. In a method according to claim 11, wherein the step of creating the first interference field comprises projecting two divergent coherent waves from two sources of divergent waves to create a first interference field, said step of creating the second interference field comprises moving the substrate to a different spacing from said sources.

15. In a method according to claim 11, wherein the step of providing the substrate provides a substrate secured to a reflecting mirror at an angle to the surface of the substrate, said step of creating a first interference field directing a planar wave at the mirror and substrate with a portion of the wave being reflected by the mirror onto the substrate to form the first interference pattern, said step of creating the second interference field being by changing the angle of incidence of the planar wave on the mirror and substrate.

16. In a method according to claim 15, wherein said step of changing the angle of incidence comprises rotating the mirror and substrate on an axis extending perpendicular to an axis of the planar wave.

* * * * *

UNITED STATES PATENT AND TRADEMARK OFFICE
CERTIFICATE OF CORRECTION

PATENT NO. : 4,859,548
DATED : August 22, 1989
INVENTOR(S) : Gerhard Heise et al It is certified that error appears in the above—identified patent and that said Letters Patent is hereby corrected as shown below:

ON THE TITLE PAGE
Insert --

Assignee--Siemens Aktiengesellschaft
          Berlin and Munich --

Signed and Sealed this

Sixth Day of December, 1994

Attest:

BRUCE LEHMAN

Attesting Officer          Commissioner of Patents and Trademarks